US010621266B2

(12) United States Patent
Belonosov et al.

(10) Patent No.: US 10,621,266 B2
(45) Date of Patent: Apr. 14, 2020

(54) THREE-DIMENSIONAL ELASTIC FREQUENCY-DOMAIN ITERATIVE SOLVER FOR FULL WAVEFORM INVERSION

(71) Applicants: Saudi Arabian Oil Company, Dhahran (SA); Trofimuk Institute of Petroleum Geology and Geophysics, Novosibirsk (RU)

(72) Inventors: Mikhail Belonosov, Delft (NL); Maxim Dmitriev, Dhahran (SA); Vladimir Cheverda, Novosibirsk (RU); Dmitry Neklyudov, Novosibirsk (RU)

(73) Assignees: Saudi Arabian Oil Company, Dhahran (SA); Trofimuk Institute of Petroleum Geology and Geophysics, Novosibirsk (RU)

( * ) Notice: Subject to any disclaimer, the term of this patent is extended or adjusted under 35 U.S.C. 154(b) by 9 days.

(21) Appl. No.: 15/755,035

(22) PCT Filed: Aug. 25, 2015

(86) PCT No.: PCT/RU2015/000535
§ 371 (c)(1),
(2) Date: Feb. 23, 2018

(87) PCT Pub. No.: WO2017/034433
PCT Pub. Date: Mar. 2, 2017

(65) Prior Publication Data
US 2018/0239739 A1    Aug. 23, 2018

(51) Int. Cl.
*G06F 17/12*   (2006.01)
*G06F 17/14*   (2006.01)
(Continued)

(52) U.S. Cl.
CPC ............ *G06F 17/12* (2013.01); *G01V 99/005* (2013.01); *G06F 17/11* (2013.01); *G06F 17/142* (2013.01);
(Continued)

(58) Field of Classification Search
CPC .................................................... G01V 99/005
See application file for complete search history.

(56) References Cited

U.S. PATENT DOCUMENTS 5,588,032 A * 12/1996 Johnson ............... A61B 5/4312
378/8
6,005,916 A * 12/1999 Johnson ................. A61B 5/05
378/87
(Continued)

FOREIGN PATENT DOCUMENTS

WO     WO2014057440        4/2014

OTHER PUBLICATIONS

Abubakar and Habashy, "Three-dimensional visco-acoustic modeling using a renormalized integral equation iterative solver," Journal of Computational Physics, vol. 249, Sep. 15, 2013, 12 pages.
(Continued)

*Primary Examiner* — Tan V Mai
(74) *Attorney, Agent, or Firm* — Fish & Richardson P.C.

(57) ABSTRACT

Certain implementations of a three-dimensional elastic frequency domain iterative solver for full waveform inversion can be implemented as a method in which frequency domain numerical simulation of elastic waves is performed in three-dimensional (3D) media.

20 Claims, 7 Drawing Sheets

(51) Int. Cl.
G06F 17/11 (2006.01)
G01V 99/00 (2009.01)
G06F 17/16 (2006.01)
G06F 17/50 (2006.01)

(52) U.S. Cl.
CPC .......... *G06F 17/16* (2013.01); *G06F 17/5009* (2013.01); *G01V 2210/67* (2013.01)

(56) References Cited

U.S. PATENT DOCUMENTS

| | | | | |
|---|---|---|---|---|
| 8,223,587 | B2* | 7/2012 | Krebs | G01V 1/282 367/43 |
| 2006/0084859 | A1* | 4/2006 | Johnson | A61B 5/0507 600/407 |
| 2006/0287596 | A1* | 12/2006 | Johnson | A61B 5/4312 600/437 |

OTHER PUBLICATIONS

Amestoy et al., "Multifrontal parallel distributed symmetric and unsymmetric solvers," Computer Methods in Applied Mechanics and Engineering vol. 184, Apr. 14, 2000, 20 pages.

Belonosov et al., "Parallel implementation of a frequency-domain iterative solver for 3D acoustic wave equation," SEG Technical Program Expanded Abstracts 2014, SEG Annual Meeting, Oct. 26-31, 2014, 5 pages.

Berenger, "A perfect matched layer for the absorption of electromagnetic waves," Journal of Computational Physics vol. 114, Oct. 1994, 16 pages.

Collino, "Application of the PML absorbing layer model to the linear elastodynamic problem in anisotropic heterogeneous media," INRIA, Rapport de recherche N. 3471, Jan. 1998, 31 pages.

Erlangga, "Advances in iterative methods and preconditioners from the Helmholtz equation," Arch. Comput. Methods English, vol. 15, Mar. 2008, 30 pages.

Guasch et al., "3D elastic wavelength tomography in the time domain," SEG Technical Program Expanded Abstracts 2010, SEG Denver 2010 Annual Meeting, Dec. 2010, 5 pages.

Li et al., "CARP-CG: A robust parallel iterative solver for frequency-domain elastic wave modeling, application to the Marmousi2 model," SEG Technical Program Expanded Abstracts, SEG Denver 2014 Annual Meeting, Oct. 26-30, 2014, 6 pages.

Ma and Yang, "A Nearly-Analytic Symplectic PRK method for Solving 2D Acoustic and Elastic Equations," SEG Technical Program Expanded Abstracts, SEG Denver 2010 Annual Meeting, Oct. 17-22, 2010, 5 pages.

Nekyludov et al., "Frequency domain interative solver for elasticity with semi-analytical preconditioner," SEG Technical Program Expanded Abstracts 2011, SEG San Antonio 2011 Annual Meeting, Sep. 18-23, 2011, 5 pages.

Nekyludov et al., "Frequency-domain Iterative Solver for 3D Acoustic Wave Equation with Two-stage Semi-analytical Preconditioner," 76th EAGE Conference and Exhibition, Amsterdam, 2014, expanded abstracts, Jun. 16-19, 2014, 5 pages.

Officer, "Introduction to the theory of sound transmission," McGraw-Hill Book Co., 1958, 39 pages.

Plessix, "A Helmholtz iterative solver for 3D seismic-imagining problems," Geophysics, vol. 72(5), Sep.-Oct. 2007, 10 pages.

Pyun et al., "3D elastic full waveform inversion in the Laplace domain," SEG Technical Program Expanded Abstracts, SEG Las Vegas 2008 Annual Meeting, Nov. 9-14, 2008, 5 pages.

Radovitsky, "Module 3: Constitutive Equations," Structural Mechanics Lecture Notes, Feb. 15, 2013, 31 pages.

Vainberg, "Principles of radiation, vanishing attenuation and limit amplitude in the general theory of partial differential equations (in Russian)," Uspekhi Matematicheskikh Nauk, vol. 21, 1966, 81 pages.

Van Der Vorst, "BI-CGSTAB: a fast and smoothly converging variant of bi-cg for the solution of nonsymmetric linear systems," SIAM J. Sci. Stat. Comput. vol. 13, No. 2, Mar. 1992, 14 pages.

Virieaux et al., "An overview of full-waveform inversion in exploration geophysics," Geophysics vol. 74, No. 6, Nov.-Dec. 2009, 26 pages.

Wang et al., "3D modeling of time-harmonic elastic waves in anisotropic media using a direct Helmholtz solver," SEG Technical Program Expanded Abstracts, 2012, SEG Las Vegas 2012 Annual Meeting, Nov. 4-9, 2012, 5 pages.

Weiss and Shragge, "Solving 3D anisotropic elastic wave equations on parallel GPU devices," Geophysics vol. 78, No. 2, 2013, 9 pages.

International Search Report and Written Opinion in International Application No. PCT/RU2015/000535, dated Jun. 15, 2016, 15 pages.

* cited by examiner

THREE-DIMENSIONAL ELASTIC FREQUENCY-DOMAIN ITERATIVE SOLVER FOR FULL WAVEFORM INVERSION

CROSS REFERENCE TO RELATED APPLICATION

This application is a national stage of International Application No. PCT/RU2015/000535 filed on Aug. 25, 2015, whose contents are hereby incorporated by reference it its entirety.

TECHNICAL FIELD

This disclosure relates to methods for numerical simulation of elastic wavefields. More particularly, the disclosure relates to methods for solving three dimensional isotropic elastic wave equation in the temporal frequency domain for application in Full-waveform inversion (FWI).

BACKGROUND

Full-waveform inversion (FWI) is a tool for deriving velocity models in areas with complex geological conditions. FWI may be implemented in the time domain or in the frequency domain (FD FWI). Each realization has some advantages and disadvantages. For example, FD FWI can allow obtaining satisfactory results by hierarchical inversion of a small group of low frequencies. One difficulty of FD FWI is the lack of an efficient frequency domain solver. Ideally, the solver should be oriented for situations which may be described briefly as: 3D+elasticity+anisotropy+attenuation. Computing wave, even in isotropic cases, fields using a 3D frequency-domain solver in such a case can be complicated because huge linear systems must be solved. In such instances, iterative solvers can be more beneficial compared to direct solvers, for example, due to lesser memory requirements.

SUMMARY

This disclosure describes technologies relating to numerical simulation of elastic wavefields, for example, using an iterative method. The techniques described in this disclosure can be implemented as a three-dimensional (3D) elastic frequency-domain iterative solver for FWI.

Certain implementations of the subject matter described here can be implemented as a method including performing frequency-domain numerical simulation of elastic waves in three-dimensional (3D) media. The 3D media can include heterogeneous media. The 3D media can include isotropic media. The 3D media can include a rock formation. With or without any one or more of the preceding features, the 3D media can include a hydrocarbon reservoir. With or without any one or more of the preceding features, performing the frequency-domain numerical simulation can include representing the 3D elastic system in a compliance form. With or without any one or more of the preceding features, representing the 3D elastic system in a compliance form can include representing the 3D elastic system by the following equation:

$$Lu = \left[i\omega M(x, y, z) - P\frac{\partial}{\partial x} - Q\frac{\partial}{\partial y} - R\frac{\partial}{\partial z}\right]u = f.$$

With or without any one or more of the preceding features, representing the 3D elastic system in a compliance form can include setting parameters of the 3D media, dimensions of a computational domain and a condition of the top boundary. With or without any one or more of the preceding features, setting parameters of the 3D media, dimensions of a computational domain and a condition of the top boundary comprises representing parameters included in the representation of the 3D elastic system by the following equations:

$$M = \begin{pmatrix} \rho I_{3\times 3} & 0 \\ 0 & S_{6\times 6} \end{pmatrix}, S = \begin{bmatrix} a & -b & -b & 0 & 0 & 0 \\ -b & a & -b & 0 & 0 & 0 \\ -b & -b & a & 0 & 0 & 0 \\ 0 & 0 & 0 & c & 0 & 0 \\ 0 & 0 & 0 & 0 & c & 0 \\ 0 & 0 & 0 & 0 & 0 & c \end{bmatrix},$$

$$a = \frac{\lambda + \mu}{\mu(2\mu + 3\lambda)}, b = \left(\frac{\lambda}{2\mu(2\mu + 3\lambda)}\right), c = \left(\frac{1}{\mu}\right).$$

With or without any one or more of the preceding features, performing the frequency-domain numerical simulation can include calculating one-dimensional (1D) background medium parameters and constructing the preconditioner. With or without any one or more of the preceding features, constructing the preconditioner can include constructing the preconditioner as an inverse to the operator shown in the following equation:

$$L_0 = i\omega M_0(z) - P\frac{\partial}{\partial x} - Q\frac{\partial}{\partial y} - R\frac{\partial}{\partial z}.$$

With or without any one or more of the preceding features, the operator $M_0$ has the same structure as the operator M. With or without any one or more of the preceding features, a complex damping function is introduced into the operator $M_0$. With or without any one or more of the preceding features, the complex damping function can be represented by the following equations: $a_0(z)=\hat{\beta}\hat{a}_0(z)$, $b_0(z)=\hat{\beta}\hat{b}_0(z)$, $c_0(z)=\hat{\beta}\hat{c}_0(z)$, $\hat{\beta}=(1+i\beta)$, $0<\beta<1$. With or without any one or more of the preceding features, performing the frequency-domain numerical simulation can include representing the initial problem as the perturbation to the preconditioner. With or without any one or more of the preceding features, representing the initial problem as the perturbation to the preconditioner can include representing the initial operator L as a combination of $L_0$ and $\delta L$. With or without any one or more of the preceding features, representing the initial operator L as a combination of $L_0$ and $\delta L$ can include representing the initial operator according to the following equation: $\delta L=-i\omega[M_0(z)-M(x,y,z)]$. With or without any one or more of the preceding features, performing the frequency-domain numerical simulation can include decomposing the computational domain in one of the lateral direction. With or without any one or more of the preceding features, performing the frequency-domain numerical simulation comprises starting an iterative process. With or without any one or more of the preceding features, the iterative process can include a parallel version of biconjugate gradient stabilized (BiCGSTAB) method. With or without any one or more of the preceding features, performing the frequency-domain numerical simulation can include performing matrix-vector multiplication at each iteration of BiCGSTAB. With or without any one or more of the preceding features, the matrix-vector multiplication can be performed by the application of a parallel Fast Fourier Transform (FFT), a banded matrix solver, and an inverse FFT. With or without any one or more of the preceding features, performing the frequency-domain numerical simulation comprises multiplying the solution by an inverse operator to the preconditioner.

Certain aspects of the subject matter described here can be implemented as a computer-readable medium storing instructions executable by data processing apparatus to perform operations described here.

Certain aspects of the subject matter described here can be implemented as a system that includes a data processing apparatus, and a computer-readable medium storing instructions executable by the data processing apparatus to perform operations described here.

The details of one or more implementations of the subject matter described in this specification are set forth in the accompanying drawings and the description below. Other features, aspects, and advantages of the subject matter will become apparent from the description, the drawings, and the claims.

DETAILED DESCRIPTION

Figure 1:
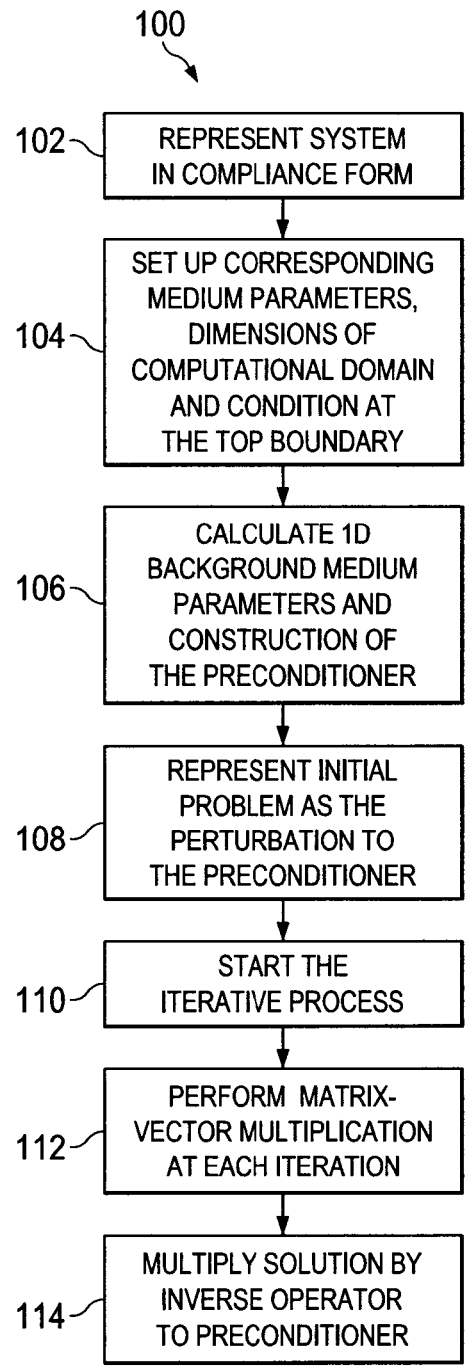
FIG. 1 is a flowchart of an example of a process for numerical simulation of 3D elastic waves in frequency domain.

This disclosure describes an iterative method for frequency-domain numerical simulation of elastic waves in three-dimensional (3D) heterogeneous, isotropic, land media. The convergence of the numerical simulation is achieved by implementing a preconditioner tuned for 3D simulations. The techniques described here can be implemented for full waveform inversion (FWI). For example, the techniques described here can be implemented at low frequencies and in regions with more vertical variations than lateral variations. Some implementations of the subject matter described here can be implemented using computing clusters, for example, high performance computing clusters with distributed memory. The algorithm described here shows good and strong scalability. Such implementations allow efficient simulation in target 3D media of large size.

In some implementations, the techniques described in this disclosure can be used to simulate 3D elastic waves in frequency domain.

As a first step, the 3D elastic system is written in compliance form as shown in Equation (1) below.

$$Lu = \left[ i\omega M(x, y, z) - P\frac{\partial}{\partial x} - Q\frac{\partial}{\partial y} - R\frac{\partial}{\partial z} \right] u = f \quad (1)$$

In Equation (1), M is an operator represented by Equation (2) below.

$$M = \begin{pmatrix} \rho I_{3\times 3} & 0 \\ 0 & S_{6\times 6} \end{pmatrix} \quad (2)$$

In Equation (2), $\rho$ is density, $I_{3\times 3}$ is an identical operator and $S_{6\times 6}$ is a matrix shown in Equation (3) below.

$$S = \begin{bmatrix} a & -b & -b & 0 & 0 & 0 \\ -b & a & -b & 0 & 0 & 0 \\ -b & -b & a & 0 & 0 & 0 \\ 0 & 0 & 0 & c & 0 & 0 \\ 0 & 0 & 0 & 0 & c & 0 \\ 0 & 0 & 0 & 0 & 0 & c \end{bmatrix} \quad (3)$$

Also, in Equation (2), a, b, and c are operators represented by Equations (4)-(6) below.

$$a = \frac{\lambda + \mu}{\mu(2\mu + 3\lambda)} \quad (4)$$

$$b = \left( \frac{\lambda}{2\mu(2\mu + 3\lambda)} \right) \quad (5)$$

$$c = \left( \frac{1}{\mu} \right) \quad (6)$$

In Equations (4)-(6), $\lambda$ and $\mu$ are Lame parameters. In addition, $S_{6\times 6} = C^{-1}$, a compliance tensor.

Returning to Equation (1), P, Q and R are represented by Equations (7)-(9) below.

$$P = \begin{bmatrix} 0 & A \\ A^T & 0 \end{bmatrix} \quad (7)$$

$$Q = \begin{bmatrix} 0 & B \\ B^T & 0 \end{bmatrix} \quad (8)$$

$$R = \begin{bmatrix} 0 & D \\ D^T & 0 \end{bmatrix} \quad (9)$$

A, B and D in Equations (7)-(9) are represented by Equations (10)-(12).

$$A = \begin{bmatrix} 1 & 0 & 0 & 0 & 0 & 0 \\ 0 & 0 & 0 & 0 & 0 & 1 \\ 0 & 0 & 0 & 0 & 1 & 0 \end{bmatrix} \quad (10)$$

$$B = \begin{bmatrix} 0 & 0 & 0 & 0 & 0 & 1 \\ 0 & 1 & 0 & 0 & 0 & 0 \\ 0 & 0 & 0 & 1 & 0 & 0 \end{bmatrix} \quad (11)$$

$$D = \begin{bmatrix} 0 & 0 & 0 & 0 & 1 & 0 \\ 0 & 0 & 0 & 1 & 0 & 0 \\ 0 & 0 & 1 & 0 & 0 & 0 \end{bmatrix} \quad (12)$$

Also, in Equation (1), $u=(u_x, u_y, u_z, \sigma_{xx}, \sigma_{yy}, \sigma_{zz}, \sigma_{xz}, \sigma_{xy})$, $f(\bar{x}_S, \omega)$ determines the type of source and its signature ($\bar{x}_S$—position of the source). The source can be a volumetric source or a point-force source. The position of the source is a point in space represented by $\bar{x}_S=(x_S, y_S, z_S)$ where it is generated. The problem is considered in an unbounded domain. It is assumed that the solution satisfies a vanishing attenuation principle. The problem is solved as a first order elastic equation.

To solve Equation (1), a preconditioner to operator L is introduced as an inverse to the operator shown in Equation (13) below.

$$L_0 = i\omega M_0(z) - P\frac{\partial}{\partial x} - Q\frac{\partial}{\partial y} - R\frac{\partial}{\partial z} \quad (13)$$

In Equation (13), the matrix operator $M_0$ enables application of the preconditioner in 3D rather than 2D. The matrix operator $M_0$ has the same structure as the operator M shown in Equation (2) above. In addition, complex damping is introduced into the matrix operator $M_0$ as shown in Equations (14)-(17) below.

$$a_0(z) = \hat{\beta}\hat{a}_0(z) \quad (14)$$

$$b_0(z) = \hat{\beta}\hat{b}_0(z) \quad (15)$$

$$c_0(z) = \hat{\beta}\hat{c}_0(z) \quad (16)$$

$$\hat{\beta} = (1+i\beta) \quad (17)$$

Real-valued functions, $\hat{a}_0(z)$, $\hat{b}_0(z)$, $\hat{c}_0(z)$ and $\rho_0(z)$ are chosen. Also, $\beta$ is a real constant with the value from 0 to 1. The 3D operator $M_0$ is chosen to ensure convergence of the iterative process. Convergence depends on spectral properties of the operator L in Equation (1). To ensure convergence, the spectrum is shifted and squeezed in a proper way by implementing complex damping. Complex damping was also considered in a two-dimensional implementation. However, the operator developed for the two-dimensional implementation did not improve the spectrum of the 3D operator because the 3D operator has a form that is different from that of the 2D operator.

The initial operator is represented as a combination of $L_0$ and operator $\delta L$ as shown in Equation (18) below.

$$\delta L = -i\omega[M_0(z) - M(x,y,z)] \quad (18)$$

This representation transforms Equation (1) into Equations (19) and (20) shown below.

$$(I - \delta L L_0^{-1})\tilde{u} = f \quad (19)$$

$$u = L_0^{-1}\tilde{u} \quad (20)$$

The computational domain is bounded to solve the system numerically. To minimize (or avoid) any artificial reflections from the boundary of the computational domain, Perfectly Matched Layer (PML) is introduced in a vertical direction. Alternatively, a sponge layer that is used in the lateral direction can also be introduced. A further alternative is to use first order absorbing boundary conditions (ABC). In some implementations, a free-surface boundary condition can be chosen at the top boundary. Introducing PML does not change the form of Equations (19) and (20). Instead, only the constant operator introduced in Equation (9) changes to $R = \gamma(z)R$, where $\gamma(z)$ is a damping function. By lateral directions we assume that the computational domain is embedded into the infinite space or half-space filled with 1D (complex) background parameters shown in equations (14)-(17), so that $\delta L \equiv 0$ outside the target area. To avoid artificial reflections, the target area is encircled by a transition layer of about two wavelengths in width. In this layer, a smooth transition from the real heterogeneous medium to the background model is performed.

The choice of depth-dependent velocity in preconditioner $L_0$ is chosen based, for example, on variability in the 3D heterogeneous media. The subsurface is assumed to have higher velocity variability in the vertical direction than in the lateral direction, even though lateral velocity variations exist. Therefore, the model is approximated to be laterally homogeneous. For such a model, one-dimensional (1D) functions, $\hat{a}_0(z)$, $\hat{b}_0(z)$, $\hat{c}_0(z)$ and $\rho_0(z)$ are chosen to minimize $\|\delta L\|_{L_2}$ over the target area.

To avoid convergence problems related to difference in magnitude of different solution vector components (for example, $u_i \sim 10^{-12}$, $\sigma_{ij} \sim 10^{-6}$), the scaling shown in Equations (21) and (22) are used.

$$u_i = \Omega u_i \quad (21)$$

$$\sigma_{ij} = \Omega^{-1}\sigma_{ij} \quad (22)$$

In Equations (21) and (22), $\Omega \sim 10^{-3}$.

The iterative process is then applied to Equation (19). The solution to Equation (19) can then be multiplied by $L_0^{-1}$ to solve Equation (1). In some implementations, the iterative process can be implemented using the Krylov-type iterative method using a matrix-free approach or other similar methods typically used to iteratively solve equations in geophysical problems. For example, the bi-conjugate gradient stabilized (BiCGSTAB) method can be chosen because of moderate memory requirements.

In general, a matrix-vector multiplication process can be implemented as fast as possible. To do so, the actions of the operators $\delta L$ and $L_0^{-1}$ can be computed on any vector successively, instead of considering Equation (19) as an integral equation. To compute the product $L_0^{-1}u_{input}$, where the vector $u_{input}$ is provided by the Krylov linear solver, the complex dumped FD system of elasticity in 3D can be resolved with a depth dependent coefficient shown in Equation (23) below.

$$L_0 u_{input} = u_{input} \quad (23)$$

Such resolution can be achieved by implementing two-dimensional (2D) Fast Fourier Transform (FFT) along the lateral variables followed by a solution of a number of systems of ordinary linear differential equations with respect to depth. After the application of the Fourier transform, several 1D systems result for each pair ($k_x$, $k_y$) of spatial frequencies. Each system is solved independently. For example, a boundary value problem for each such system is solved using a finite-different approximation of derivatives in vertical direction. To do so, a $4^{th}$ order approximation staggered grid scheme can be used. The result is a set of small banded systems that can be solved quickly, for example, using an Intel Math Kernel Library. The matrix-vector product procedure can be finalized using a point-by-point multiplication/subtraction of the given 3D functions as shown in Equation (23) below.

$$u_{input} = u_{input} - \delta L \cdot u_{output} \quad (24)$$

Figure 2:
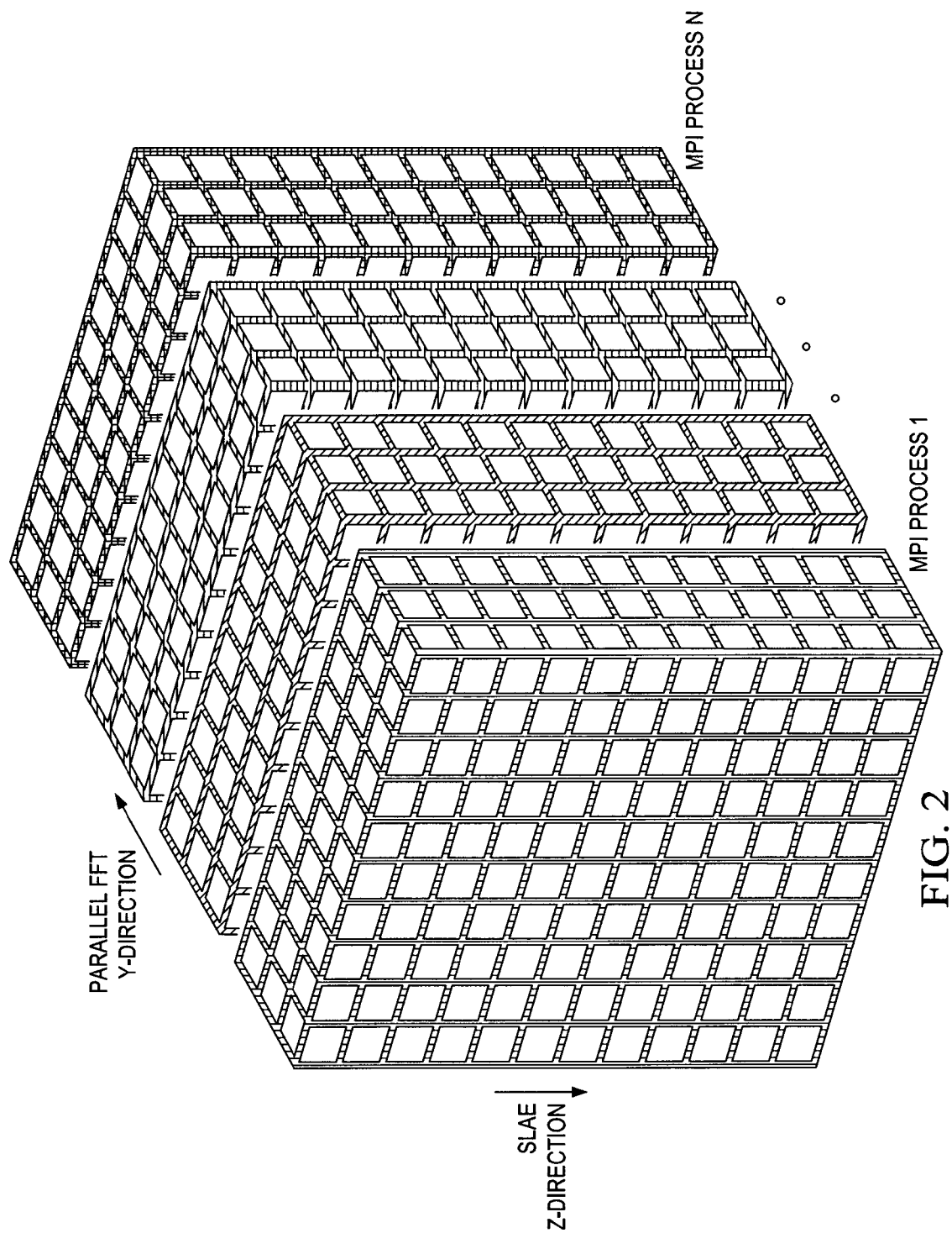
FIG. 2 is a schematic diagram representing message passing interface (MPI) parallelization with domain decomposition in a Y-direction.

The techniques described above can be parallelized via MPI using an approach based on domain decomposition of the target area along one of the horizontal direction and application of the parallel version of BiCGSTAB and FFT, as shown in FIG. 2. Doing so can enable using software packages with FFT designed for modern HPC architectures to be used. Each MPI process solves its own set of small banded SLAE independently of other MPI processes.

FIG. 1 is a flowchart of an example of a process 100 for numerical simulation of 3D elastic waves in frequency domain. The FWI process uses the results of the techniques described here several times at each iteration. At 102, the 3D elastic system is represented in compliance form. At 104, corresponding medium parameters, dimensions of computational domain and condition at the top boundary are set up. At 106, one-dimensional (1D) background medium parameters are calculated and preconditioner is constructed. At 108, the initial problem is represented as the perturbation to the preconditioner. At 110, the iterative process is started. At 112, matrix-vector multiplication is performed at each iteration. At 114, the solution is multiplied by the inverse operator to preconditioner. The techniques described here are matrix-free. The preconditioner ensures convergence of the iterative process. The techniques can be implemented using 2.5 points per minimal wavelength in lateral direction. The techniques can be extended to viscoelasticity.

Example Verification

The techniques described here were verified by comparison with an exact solution obtained for 3D homogenous media implementing a PML boundary condition at the top. The verification showed that the results of the techniques described here are in very good agreement with the exact solution.

Example Benchmarking

Figure 3:
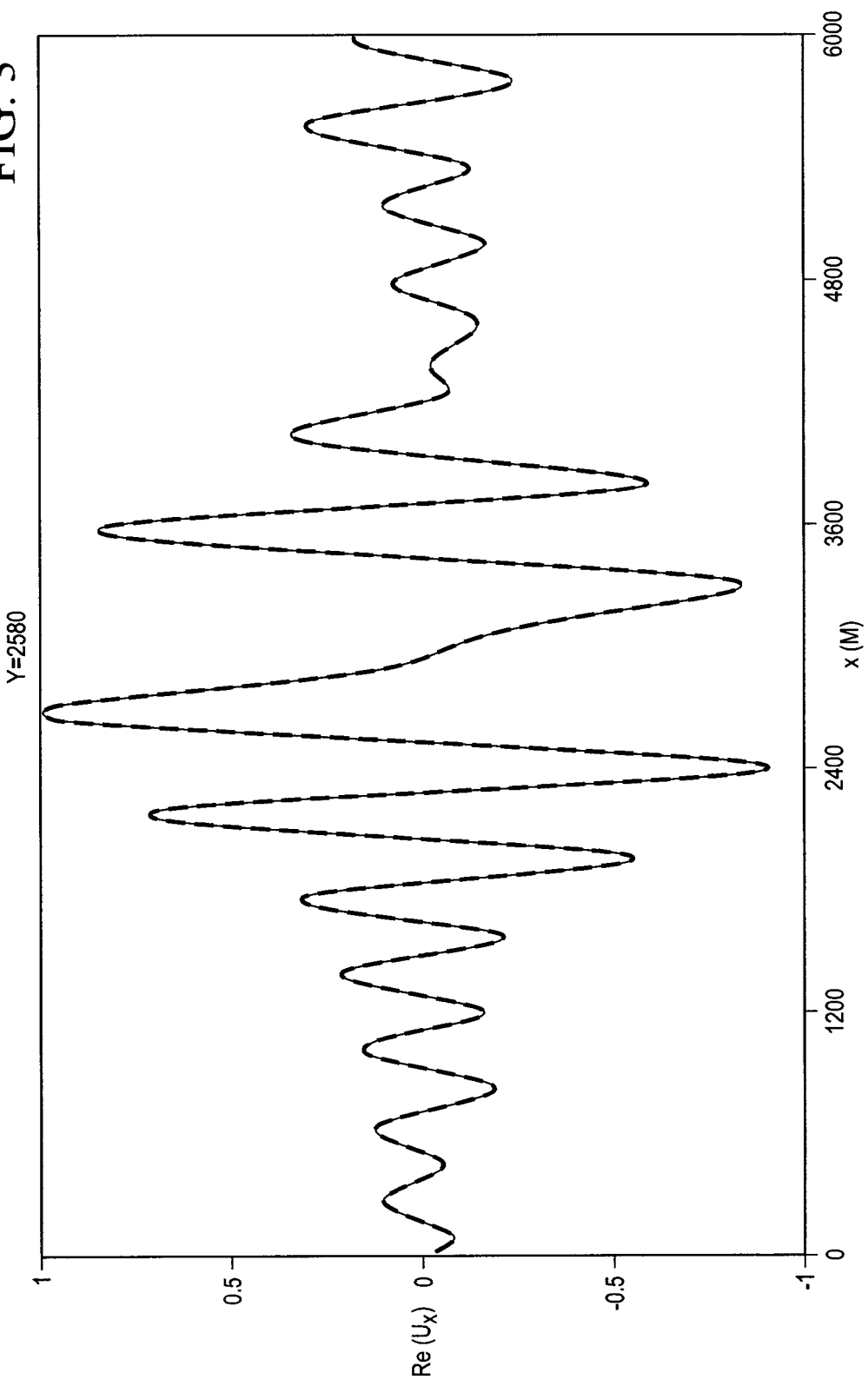
FIG. 3 is a plot comparing simulated horizontal velocity and a time-domain solver for a 3D heterogeneous model with absorbing boundary condition at the top.
Figure 4:
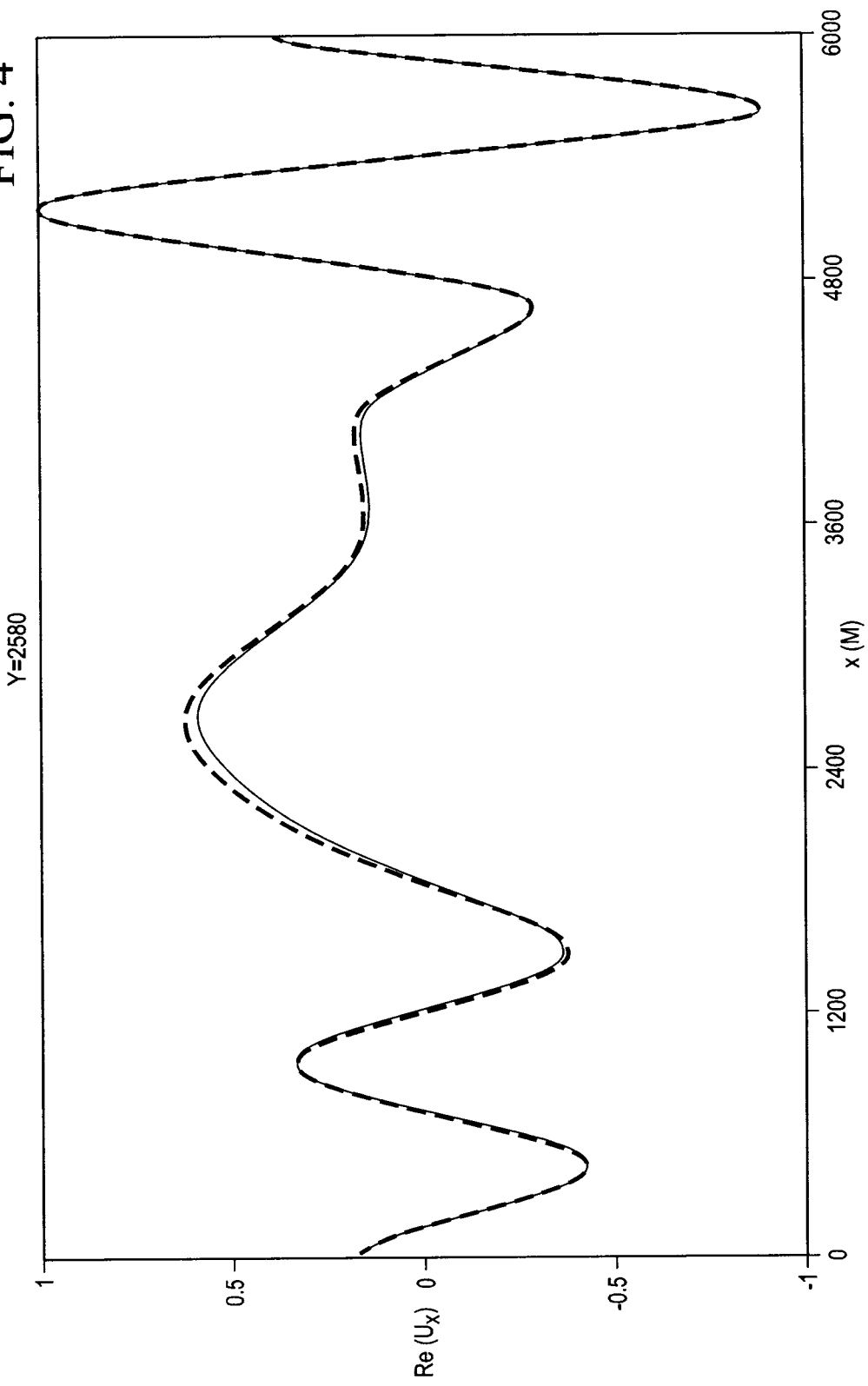
FIG. 4 is a plot comparing simulated horizontal velocity and a time-domain solver for a 3D heterogeneous model with free surface boundary condition at the top.

The techniques described here were then benchmarked with a known time domain solver based on explicit $4^{th}$ order finite-difference for complex fragment of 3D SEG/EAGE Overthrust model with different boundary conditions at the top (e.g., PML and free surface). The size of the computational domain was 200×200×187 points with the uniform grid size $h_{x,y}$=30 m in the lateral direction and $h_z$=10 m in depth. The vertical point-force source was located in the middle of the model at 20 m depth. The receivers were placed along the horizontal plane at a depth of 900 m. The wave-field was simulated for frequency of 10 Hz. The tolerance level in the iterative process was chosen to be equal to $10^{-5}$. Some cross-sections of simulated FD $u_x$-velocity component are presented in FIGS. 3 and 4. FIGS. 3 and 4 show plots comparing Fourier transformed results of standard (2, 4) time domain finite-difference simulation. The results were normalized on their maximum value. With PML at the top boundary, the iterative process converged in 58 iterations. With free surface at the top boundary, the iterative process converged in 80 iterations because of arising surface waves.

Example Scalability Estimation

Figure 5:
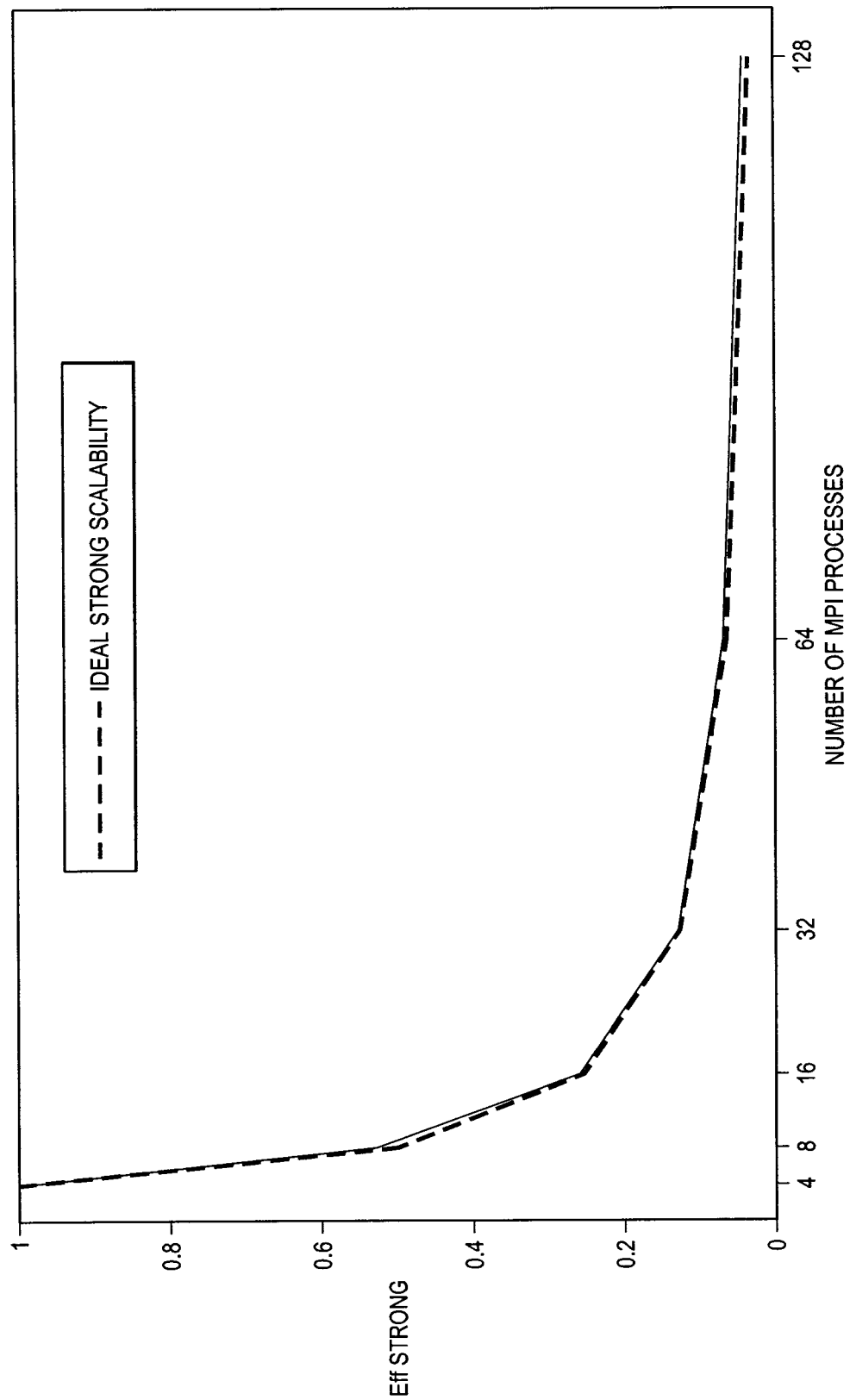
FIG. 5 is a plot showing scalability of a parallel iterative solver.

As described above, the techniques described above can be parallelized via MPI. Consequently, the scalability of the parallel algorithm was tested. The results of the test are shown in FIG. 5. FIG. 5 is a plot showing scalability of a parallel iterative solver. The scalability tests demonstrate the ability of the algorithm to reduce the total computational time with increasing number of MPI processes and is calculated using the formula shown in Equation (24) below.

$$eff_{strong}(N)=t(N)/t(N_0) \quad (25)$$

In Equation (25), t(N) is the total computational time for N MPI processes, $N_0$ is an initial number of processes, $t(N_0)$ is the corresponding computational time. The homogeneous model of 800×800×200 grid points with a vertical point-force source placed in the middle was considered. The uniform grid step is equal to 10 m. The wave-field was stimulated at a frequency of 5 Hz. The target area was decomposed successively into a power of two number of subdomains. Each MPI process corresponded to the whole computational node. FIG. 5 shows a scalability curve in which $N_0$=4. The behavior is in very good agreement with the ideal strong scalability curve indicating that the time spent on exchanges between MPI processes do not significantly influence the acceleration time due to parallelization.

Example Application to a Land Model

Figure 6:
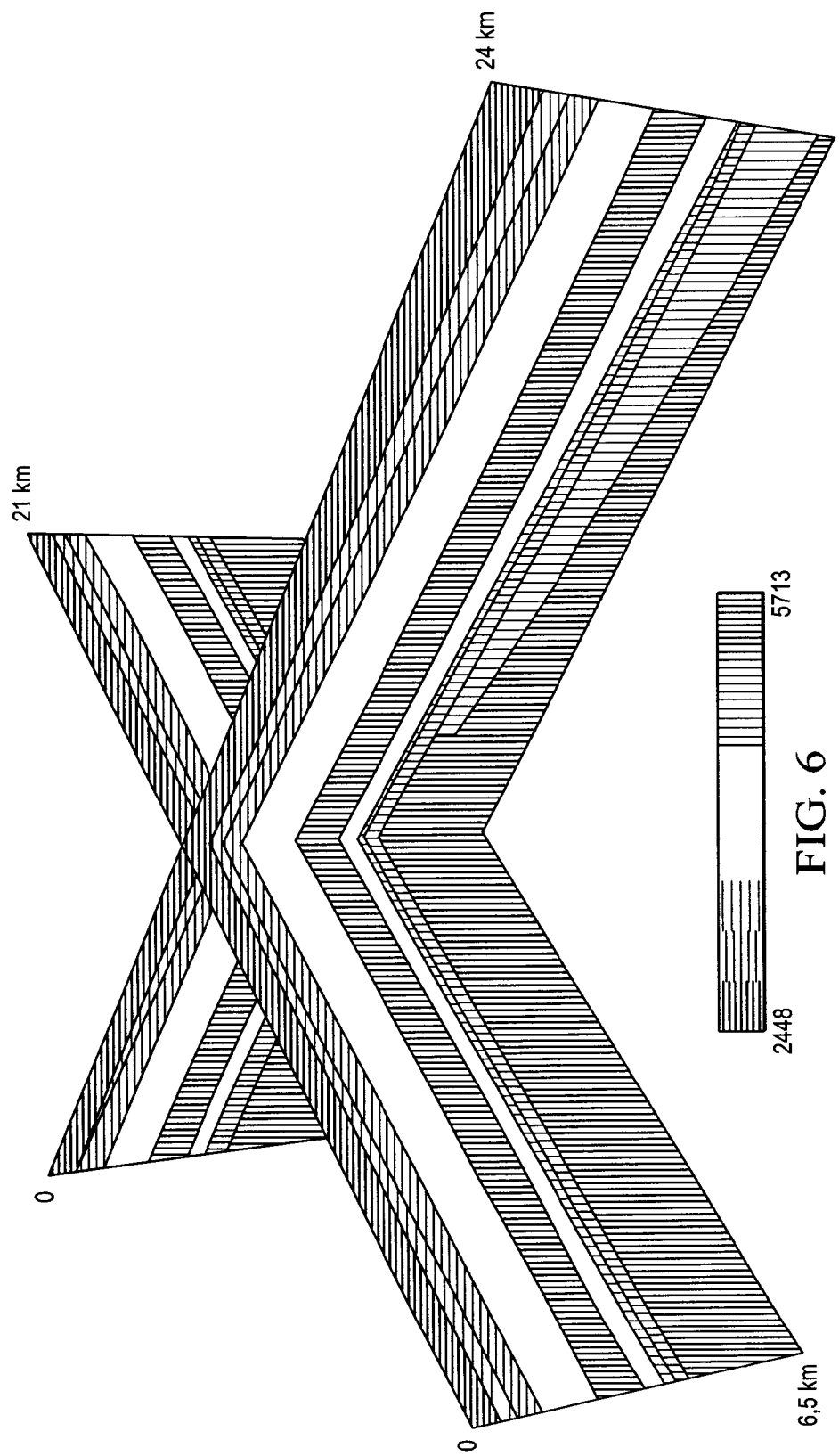
FIG. 6 is a plot showing velocity distribution in a land model.
Figure 7:
FIG. 7 is a schematic diagram showing a real part of a frequency-domain horizontal velocity component.

The techniques described here were applied to simulate an elastic wavefield in a typical land model having a size of about 24×21×6.5 km with a uniform grid step of $h_x$=$h_y$=25 m and $h_z$=10 m. The simulation was performed at a frequency of 5 Hz. PML boundary condition was used at the top surface. The vertical point-force source was placed in the middle of the target area at 20 m depth. The simulation was performed using 450 GB RAM implemented using 4 computational nodes with 128 GB RAM each. The iterative process converged in 120 iterations. FIG. 6 is a plot showing velocity distribution in a land model. FIG. 7 is a schematic diagram showing a real part of a frequency-domain horizontal velocity component. FIG. 7 shows the real part of simulated frequency-domain $u_x$-velocity component (slices at Z=50 m, Y=12 km and X=9.6 km).

Implementations of the subject matter and the operations described in this specification can be implemented in digital electronic circuitry, or in computer software, firmware, or hardware, including the structures disclosed in this specification and their structural equivalents, or in combinations of one or more of them. Implementations of the subject matter described in this specification can be implemented as one or more computer programs, i.e., one or more modules of computer program instructions, encoded on computer storage medium for execution by, or to control the operation of, data processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate physical components or media (e.g., multiple CDs, disks, or other storage devices).

The operations described in this specification can be implemented as operations performed by a data processing apparatus on data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, implementations of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

The invention claimed is:

1. A non-transitory computer-readable medium storing instructions executable by data processing apparatus to perform operations comprising:

representing a three-dimensional (3D) elastic system in compliance form, the 3D elastic system representing 3D land media, the compliance form comprising $$Lu = \left[i\omega M(x, y, z) - P\frac{\partial}{\partial x} - Q\frac{\partial}{\partial y} - R\frac{\partial}{\partial z}\right]u = f,$$

wherein u represents a velocity through the media, wherein M is an operator represented by $$M = \begin{pmatrix} \rho I_{3\times 3} & 0 \\ 0 & S_{6\times 6} \end{pmatrix},$$

$\rho$ is density, $I_{3\times 3}$ is an identical operator and $S_{6\times 6}$ is a matrix represented by $$S = \begin{bmatrix} a & -b & -b & 0 & 0 & 0 \\ -b & a & -b & 0 & 0 & 0 \\ -b & -b & a & 0 & 0 & 0 \\ 0 & 0 & 0 & c & 0 & 0 \\ 0 & 0 & 0 & 0 & c & 0 \\ 0 & 0 & 0 & 0 & 0 & c \end{bmatrix},$$

a is an operator represented by $$a = \frac{\lambda + \mu}{\mu(2\mu + 3\lambda)},$$

b is an operator represented by $$b = \left(\frac{\lambda}{2\mu(2\mu + 3\lambda)}\right),$$

c is an operator represented by $$c = \left(\frac{1}{\mu}\right),$$

$\lambda$ and $\mu$ are Lame parameters, $S_{6\times 6}$ is compliance tensor $C^{-1}$, P is represented by $$P = \begin{vmatrix} 0 & A \\ A^T & 0 \end{vmatrix},$$

Q is represented by $$Q = \begin{vmatrix} 0 & B \\ B^T & 0 \end{vmatrix},$$

R is represented by $$R = \begin{bmatrix} 0 & D \\ D^T & 0 \end{bmatrix}, \text{wherein } A = \begin{bmatrix} 1 & 0 & 0 & 0 & 0 & 0 \\ 0 & 0 & 0 & 0 & 0 & 1 \\ 0 & 0 & 0 & 0 & 1 & 0 \end{bmatrix},$$

$$\text{wherein } B = \begin{bmatrix} 0 & 0 & 0 & 0 & 0 & 1 \\ 0 & 1 & 0 & 0 & 0 & 0 \\ 0 & 0 & 0 & 1 & 0 & 0 \end{bmatrix},$$

$$\text{wherein } D = \begin{bmatrix} 0 & 0 & 0 & 0 & 1 & 0 \\ 0 & 0 & 0 & 1 & 0 & 0 \\ 0 & 0 & 1 & 0 & 0 & 0 \end{bmatrix};$$

determine parameters corresponding to the media, dimensions of a computational domain to solve the compliance form and condition at a top boundary of the computational domain;

determine one-dimensional (1D) background parameters of the media and a preconditioner solve the compliance form within the computational domain;

representing an initial problem as a perturbation of the preconditioner;

iteratively performing matrix-vector multiplication to solve the compliance form;

determining a velocity distribution of the velocity through the media in response to iteratively performing the matrix-vector multiplication.

2. The medium of claim 1, wherein the 3D land media comprises heterogeneous media.

3. The medium of claim 1, wherein the 3D land media comprises isotropic media.

4. The medium of claim 1, wherein the 3D land media comprises a rock formation.

5. The medium of claim 1, wherein the 3D land media comprises a hydrocarbon reservoir.

6. The medium of claim 1, wherein determining the preconditioner comprises constructing the preconditioner as an inverse to the operator shown in the following equation:

$$L_0 = i\omega M_0(z) - P\frac{\partial}{\partial x} - Q\frac{\partial}{\partial y} - R\frac{\partial}{\partial z},$$

wherein the operator $M_0$ has the same structure as the operator M.

7. The medium of claim 6, wherein a complex damping function is introduced into the operator $M_0$.

8. The medium of claim 7, wherein the complex damping function is represented by the following equations: $a_0(z)=\hat{\beta}\hat{a}_0(z)$, $b_0(z)=\hat{\beta}\hat{b}_0(z)$, $c_0(z)=\hat{\beta}\hat{c}_0(z)\hat{\beta}=(1+i\beta)$.

9. The medium of claim 1, wherein representing the initial problem as the perturbation to the preconditioner comprises representing the initial operator L as a combination of $L_0$ and $\delta L$, wherein representing the initial operator L as a combination of $L_0$ and $\delta L$ comprises representing the initial operator according to the following equation: $\delta L=-i\omega[M_0(z)-M(x,y,z)]$.

10. The medium of claim 1, wherein the matrix-vector multiplication is performed by the application of a parallel Fast Fourier Transform (FFT), a banded matrix solver, and an inverse FFT.

11. A system comprising:
data processing apparatus; and
a computer-readable medium storing instructions executable by the data processing apparatus to perform operations comprising:
representing a three-dimensional (3D) elastic system in compliance form, the 3D elastic system representing 3D land media, the compliance form comprising $$Lu = \left[i\omega M(x, y, z) - P\frac{\partial}{\partial x} - Q\frac{\partial}{\partial y} - R\frac{\partial}{\partial z}\right]u = f,$$

wherein u represents a velocity through the media, wherein M is an operator represented by $$M = \begin{pmatrix} \rho I_{3\times 3} & 0 \\ 0 & S_{6\times 6} \end{pmatrix},$$

$\rho$ is density, $I_{3\times 3}$ is an identical operator and $S_{6\times 6}$ is a matrix represented by $$S = \begin{bmatrix} a & -b & -b & 0 & 0 & 0 \\ -b & a & -b & 0 & 0 & 0 \\ -b & -b & a & 0 & 0 & 0 \\ 0 & 0 & 0 & c & 0 & 0 \\ 0 & 0 & 0 & 0 & c & 0 \\ 0 & 0 & 0 & 0 & 0 & c \end{bmatrix},$$

a is an operator represented by $$a = \frac{\lambda + \mu}{\mu(2\mu + 3\lambda)},$$

b is an operator represented by $$b = \left(\frac{\lambda}{2\mu(2\mu + 3\lambda)}\right),$$

c is an operator represented by $$c = \left(\frac{1}{\mu}\right),$$

$\lambda$ and $\mu$ are Lame parameters, $S_{6\times 6}$ is compliance tensor $C^{-1}$, P is represented by $$P = \begin{bmatrix} 0 & A \\ A^T & 0 \end{bmatrix},$$

Q is represented by $$Q = \begin{bmatrix} 0 & B \\ B^T & 0 \end{bmatrix},$$

R is represented by $$R = \begin{bmatrix} 0 & D \\ D^T & 0 \end{bmatrix}, \text{wherein } A = \begin{bmatrix} 1 & 0 & 0 & 0 & 0 & 0 \\ 0 & 0 & 0 & 0 & 0 & 1 \\ 0 & 0 & 0 & 0 & 1 & 0 \end{bmatrix},$$

wherein $B = \begin{bmatrix} 0 & 0 & 0 & 0 & 0 & 1 \\ 0 & 1 & 0 & 0 & 0 & 0 \\ 0 & 0 & 0 & 1 & 0 & 0 \end{bmatrix},$ wherein $D = \begin{bmatrix} 0 & 0 & 0 & 0 & 1 & 0 \\ 0 & 0 & 0 & 1 & 0 & 0 \\ 0 & 0 & 1 & 0 & 0 & 0 \end{bmatrix};$ determine parameters corresponding to the media, dimensions of a computational domain to solve the compliance form and condition at a top boundary of the computational domain;

determine one-dimensional (1D) background parameters of the media and a preconditioner solve the compliance form within the computational domain;

representing an initial problem as a perturbation of the preconditioner;

iteratively performing matrix-vector multiplication to solve the compliance form;

determining a velocity distribution of the velocity through the media in response to iteratively performing the matrix-vector multiplication.

12. The system of claim 11, wherein the 3D land media comprises heterogeneous media.

13. The system of claim 11, wherein the 3D land media comprises isotropic media.

14. The system of claim 11, wherein the 3D land media comprises a rock formation.

15. The system of claim 11, wherein the 3D land media comprises a hydrocarbon reservoir.

16. The system of claim 11, wherein determining the preconditioner comprises constructing the preconditioner as an inverse to the operator shown in the following equation:

$$L_0 = i\omega M_0(z) - P\frac{\partial}{\partial x} - Q\frac{\partial}{\partial y} - R\frac{\partial}{\partial z},$$

wherein the operator $M_0$ has the same structure as the operator M.

17. The system of claim 16, wherein a complex damping function is introduced into the operator $M_0$.

18. The system of claim 17, wherein the complex damping function is represented by the following equations: $a_0(z)=\hat{\beta}\hat{a}_0(z)$, $b_0(z)=\hat{\beta}\hat{b}_0(z)$, $c_0(z)=\hat{\beta}\hat{c}_0(z)\hat{\beta}=(1+i\beta)$.

19. The system of claim 11, wherein representing the initial problem as the perturbation to the preconditioner comprises representing the initial operator L as a combination of $L_0$ and $\delta L$ wherein representing the initial operator L as a combination of $L_0$ and $\delta L$ comprises representing the initial operator according to the following equation: $\delta L=-i\omega[M_0(z)-M(x, y,z)]$.

20. The system of claim 11, wherein the matrix-vector multiplication is performed by the application of a parallel Fast Fourier Transform (FFT), a banded matrix solver, and an inverse FFT.

* * * * *